(12) United States Patent  
Stepanovic et al.

(10) Patent No.: US 9,998,134 B1
(45) Date of Patent: Jun. 12, 2018

(54) ANALOG-TO-DIGITAL CONVERTER CIRCUIT CALIBRATION SYSTEM

(71) Applicant: Apple Inc., Cupertino, CA (US)

(72) Inventors: Dusan Stepanovic, Mountain View, CA (US); Mansour Keramat, San Jose, CA (US)

(73) Assignee: Apple Inc., Cupertino, CA (US)

( * ) Notice: Subject to any disclaimer, the term of this patent is extended or adjusted under 35 U.S.C. 154(b) by 0 days. days.

(21) Appl. No.: 15/658,020

(22) Filed: Jul. 24, 2017

(51) Int. Cl.
  *H03M 1/10* (2006.01)
  *H03M 1/12* (2006.01)

(52) U.S. Cl.
  CPC ....... *H03M 1/1014* (2013.01); *H03M 1/1009* (2013.01); *H03M 1/12* (2013.01)

(58) Field of Classification Search
  CPC ..... H03M 1/1014; H03M 1/12; H03M 1/1009
  USPC .................................................. 341/120, 155
  See application file for complete search history.

(56) References Cited

U.S. PATENT DOCUMENTS

| | | | |
|---|---|---|---|
| 7,474,239 B2 * | 1/2009 | Su | H03M 1/002 341/119 |
| 8,519,875 B2 * | 8/2013 | Straayer | H03M 1/1057 327/517 |
| 8,604,953 B2 | 12/2013 | Ali | |
| 8,749,410 B1 | 6/2014 | Van Der Goes et al. | |
| 8,872,680 B2 * | 10/2014 | Ali | H03M 1/10 341/118 |
| 9,030,340 B1 * | 5/2015 | Waltari | H03M 1/1245 341/118 |
| 9,191,019 B2 | 11/2015 | Keramat et al. | |
| 2016/0182073 A1 | 6/2016 | Speir et al. | |

OTHER PUBLICATIONS

EE247 Lecture 24, Pipeline ADCs, 2007 H.K., pp. 1-51.

* cited by examiner

*Primary Examiner* — Brian Young
(74) *Attorney, Agent, or Firm* — Meyertons, Hood, Kivlin, Kowert & Goetzel, P.C.

(57) ABSTRACT

In various embodiments, at least one analog-to-digital converter (ADC) channel circuit may be used to convert an analog input signal into an output digital signal. A comparator threshold adjustment circuit may pseudorandomly modify at least one comparator threshold. A postprocessing circuit may identify, based on outputs of the ADC channel circuits, an ADC coefficient and may modify an output digital signal based on the ADC coefficient. As a result, the ADC channel circuits may more accurately convert the analog input signal into an output digital signal, as compared to a system that uses ADC channel circuits but does not include a postprocessing circuit. Further, a similar result may be obtained, as compared to a system that uses a higher gain amplifier, a higher speed amplifier, or both, but does not modify the one or more outputs.

20 Claims, 7 Drawing Sheets

ANALOG-TO-DIGITAL CONVERTER CIRCUIT CALIBRATION SYSTEM

BACKGROUND

Technical Field

This disclosure relates generally to an analog-to-digital converter circuit calibration system.

Description of the Related Art

Analog-to-digital converter (ADC) circuits may convert an analog signal into a digital signal. In some cases, the signal may be processed in a pipeline of stages. The pipelined operation may enable pipeline ADC circuits to process data at a higher throughput, as compared to other architectures. However, such systems may use operational amplifiers that consume more power as compared to ADC circuits that are not pipelined and provide similar output resolution.

SUMMARY

In various embodiments, an analog-to-digital converter (ADC) circuit calibration system includes at least one ADC channel circuit, a calibration signal generation circuit, a comparator threshold adjustment circuit, and a postprocessing circuit. The at least one ADC channel circuit is configured to receive an analog input signal and output a respective digital signal. One or more comparator thresholds of the ADC channel circuit (e.g., multiple comparator thresholds of multiple ADC channel circuits, multiple comparator thresholds of one ADC channel circuit, or one comparator threshold of one ADC channel circuit) may be pseudo-randomly modified. Accordingly, in some cases, the at least one ADC channel circuit may produce different outputs (e.g., at different times or at a single time) despite receiving a single input signal. The postprocessing circuit may identify an ADC coefficient of the at least one ADC channel circuit based on at least two digital signals from the at least one ADC channel circuit. The ADC coefficient may include at least one of a stage gain coefficient, a memory coefficient, another error coefficient. The postprocessing circuit may generate an output digital signal based on the at least one digital signal. The postprocessing circuit may modify the output digital signal based on the ADC coefficient. As a result, the ADC circuit calibration system may output values that have a similar output resolution to some systems that include higher gain amplifiers, higher speed amplifiers, or both. However, because lower gain amplifiers, lower speed amplifiers, or both may be used, the ADC circuit calibration system may have a lower power consumption, a lower area, or both.

In some embodiments, the same input signal may be one of multiple interleaved input signals sent to the ADC channel circuits. As a result, the multiple ADC channel circuits may have a higher throughput, as compared to systems that do not use interleaved input signals. Additionally, in some cases, the postprocessing circuit may iteratively adjust the identified ADC coefficient based on subsequently received outputs of the ADC channel circuits. As a result, in some cases, the ADC coefficient may be iteratively identified as more data values (additional outputs of the ADC channel circuits) are received.

Figure 1:
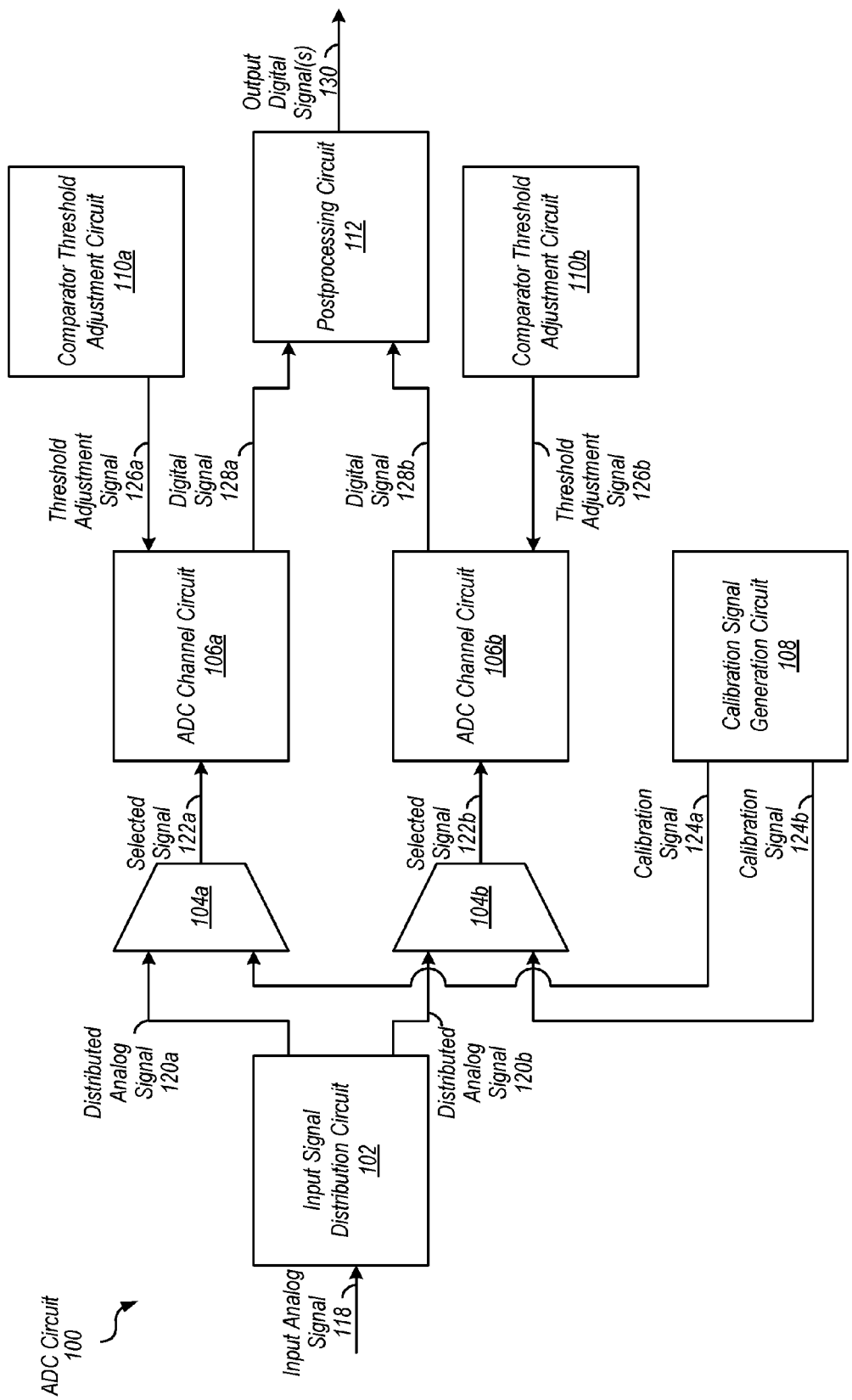
FIG. 1 is a block diagram illustrating one embodiment of an analog-to-digital converter circuit of an analog-to-digital converter circuit calibration system.

Although the embodiments disclosed herein are susceptible to various modifications and alternative forms, specific embodiments are shown by way of example in the drawings and are described herein in detail. It should be understood, however, that drawings and detailed description thereto are not intended to limit the scope of the claims to the particular forms disclosed. On the contrary, this application is intended to cover all modifications, equivalents and alternatives falling within the spirit and scope of the disclosure of the present application as defined by the appended claims.

This disclosure includes references to "one embodiment," "a particular embodiment," "some embodiments," "various embodiments," or "an embodiment." The appearances of the phrases "in one embodiment," "in a particular embodiment," "in some embodiments," "in various embodiments," or "in an embodiment" do not necessarily refer to the same embodiment. Particular features, structures, or characteristics may be combined in any suitable manner consistent with this disclosure.

Within this disclosure, different entities (which may variously be referred to as "units," "circuits," other components, etc.) may be described or claimed as "configured" to perform one or more tasks or operations. This formulation— [entity] configured to [perform one or more tasks]—is used herein to refer to structure (i.e., something physical, such as an electronic circuit). More specifically, this formulation is used to indicate that this structure is arranged to perform the one or more tasks during operation. A structure can be said to be "configured to" perform some task even if the structure is not currently being operated. A "memory device configured to store data" is intended to cover, for example, an integrated circuit that has circuitry that performs this function during operation, even if the integrated circuit in question is not currently being used (e.g., a power supply is not connected to it). Thus, an entity described or recited as "configured to" perform some task refers to something physical, such as a device, circuit, memory storing program instructions executable to implement the task, etc. This phrase is not used herein to refer to something intangible.

The term "configured to" is not intended to mean "configurable to." An unprogrammed FPGA, for example, would not be considered to be "configured to" perform some specific function, although it may be "configurable to" perform that function after programming.

Reciting in the appended claims that a structure is "configured to" perform one or more tasks is expressly intended not to invoke 35 U.S.C. § 112(f) for that claim element. Accordingly, none of the claims in this application as filed are intended to be interpreted as having means-plus-function elements. Should Applicant wish to invoke Section 112(f) during prosecution, it will recite claim elements using the "means for" [performing a function] construct.

As used herein, the term "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

As used herein, the phrase "in response to" describes one or more factors that trigger an effect. This phrase does not foreclose the possibility that additional factors may affect or otherwise trigger the effect. That is, an effect may be solely in response to those factors, or may be in response to the specified factors as well as other, unspecified factors. Consider the phrase "perform A in response to B." This phrase specifies that B is a factor that triggers the performance of A. This phrase does not foreclose that performing A may also be in response to some other factor, such as C. This phrase is also intended to cover an embodiment in which A is performed solely in response to B.

As used herein, the terms "first," "second," etc. are used as labels for nouns that they precede, and do not imply any type of ordering (e.g., spatial, temporal, logical, etc.), unless stated otherwise. For example, in a circuit that includes six amplifiers, the terms "first amplifier" and "second amplifier" can be used to refer to any two of the six amplifiers, and not, for example, just logical amplifiers 0 and 1.

When used in the claims, the term "or" is used as an inclusive or and not as an exclusive or. For example, the phrase "at least one of x, y, or z" means any one of x, y, and z, as well as any combination thereof (e.g., x and y, but not z).

In the following description, numerous specific details are set forth to provide a thorough understanding of the disclosed embodiments. One having ordinary skill in the art, however, should recognize that aspects of disclosed embodiments might be practiced without these specific details. In some instances, well-known circuits, structures, signals, computer program instruction, and techniques have not been shown in detail to avoid obscuring the disclosed embodiments.

DETAILED DESCRIPTION

In an analog-to-digital converter (ADC) channel circuit, an output may be formed as a result of a pipeline of one or more stages each converting a portion of an analog input signal into respective digital bits. The output may be formed according to the following formula:

$$OUT = \sum_{i=1}^{i=Nstg} w_i D_i$$

where $D_i$ is a stage output of a current (e.g., ith stage) stage corresponding to a current input, $w_i$ is a weight coefficient of the current stage of the ADC channel circuit, and Nstg is a number of pipeline stages within the ADC channel circuit. In some embodiments, the ADC coefficient $w_i$ may vary from stage to stage, from ADC channel circuit to ADC channel circuit and may further vary over time (e.g., due to temperature variations). However, an output signal (e.g., a digital signal) may depend on input signals (e.g., analog signals) received at the ADC channel circuit prior to an instant input signal. If these prior input signals are not considered, memory errors may be introduced. However, as described herein, these memory errors may be identified and reduced. For example, when three input signals (e.g., a current input signal and two previous input signals) are considered, the following formula may instead be used:

$$OUT = \sum_{i=1}^{i=3Nstg} w_i D_i$$

where $w_i$ to $w_{Nstg}$ correspond to the current input signal, $w_{Nstg+1}$ to $w_{2Nstg}$ correspond to a first previous input signal, and $w_{2Nstg+1}$ to $w_{3Nstg}$ correspond to a second previous input signal. As a result of considering prior input signals, ADC coefficient(s) $w_i$ (e.g., stage gain coefficients $w_1$ to $w_{Nstg}$ and memory coefficients $w_{Nstg+1}$ to $w_{3Nstg}$) may be calculated more accurately. When ADC coefficient(s) are calculated more accurately, a ADC circuit calibration system may, in some cases, more accurately compensate for memory errors, as compared to a system that does not consider prior input signals.

An ADC circuit calibration system is disclosed herein where a same input signal is converted to a digital signal at least twice using different instances of an ADC channel circuit having different comparator thresholds. For example, a comparator threshold of a first ADC channel circuit may be modified by a first amount and a comparator threshold of a second ADC channel circuit may be modified by a second amount. After the comparator thresholds have been modified, the same input signal may be sent to the first and second ADC channel circuits. In some embodiments, the first and second ADC channel circuits may be interleaved. Outputs of the ADC channel circuits may be synchronized.

The synchronized outputs may be analyzed to identify one or more ADC coefficients (e.g., a stage gain coefficient, a memory coefficient, another coefficient, or any combination thereof) of one or more ADC channel circuits. For example, in an example considering three input signals, the three following equations may be considered:

$$OUT1 = \sum_{i=1}^{i=3Nstg} w_{i1} D_{i1}$$

$$OUT2 = \sum_{i=1}^{i=3Nstg} w_{i2} D_{i2}$$

$$e = OUT1 - OUT2 = \sum_{i=1}^{i=3Nstg} w_{i1} D_{i1} - w_{i2} D_{i2}$$

where OUT1 and OUT2 correspond to different ADC channel circuits (e.g., having different comparator thresholds) and where e represents an error value. The ADC coefficients may be identified as values that result in an error value having an absolute value that is smaller than a threshold value (e.g., a smallest error value). Based on the identified ADC coefficients, an output corresponding to the same input signal (e.g., an output generated based on the same input signal) may be modified. As a result, the ADC circuit calibration system may prevent at least some errors (e.g., resulting from interleaving ADC channel circuits, using low speed or low gain amplifiers, etc.) in an ADC circuit. Further, the ADC circuit calibration system may produce results having a similar resolution at a similar throughput and may consume less power, as compared to systems including at least some ADC circuits that include higher-gain amplifiers, higher speed amplifiers, or both.

Further, an ADC circuit calibration system is disclosed herein where a same input signal is converted to a digital signal at least twice using a same ADC channel circuit having different configurations. For example, a comparator threshold of the ADC channel circuit may be modified by a first amount and the same input signal may be sent to the ADC channel circuit. Subsequently, the comparator threshold of the ADC channel circuit may be modified by a second amount and the same input signal may again be applied. Outputs of the ADC channel circuit may be synchronized.

$$OUT1 = \sum_{i=1}^{i=3Nstg} w_i D_{i1}$$

$$OUT2 = \sum_{i=1}^{i=3Nstg} w_i D_{i2}$$

$$e = OUT1 - OUT2 = \sum_{i=1}^{i=3Nstg} w_i (D_{i1} - D_{i2})$$

where OUT1 and OUT2 correspond to different instances of the input signal (e.g., the ADC channel circuit having different comparator thresholds) and where e represents an error value. The ADC coefficient may be identified as a value that result in an error value having an absolute value that is smaller than a threshold value (e.g., a smallest error value). Based on the identified ADC coefficient, an output corresponding to the same input signal (e.g., an output generated based on the same input signal) may be modified. As a result, the ADC circuit calibration system may prevent at least some errors (e.g., resulting from using low speed or low gain amplifiers, etc.) in an ADC circuit. Further, the ADC circuit calibration system may produce results having a similar resolution at a similar throughput and may consume less power, as compared to systems including an ADC circuit that includes higher-gain amplifiers, higher speed amplifiers, or both.

As used herein, an amplifier may be said to be "low gain" if the amplifier has a gain value that is below an accepted value for a specified output resolution (e.g., a specified number of output bits). Further, an ADC channel circuit may be considered "low-gain" if it includes at least one low-gain amplifier.

As used herein, an amplifier may be said to be "low speed" if the amplifier takes longer than an accepted value for a specified output resolution. Further, an ADC channel circuit may be considered "low speed" if it includes at least one low speed amplifier.

As used herein, a plurality of ADC channel circuits may be said to be "interleaved" if they alternately sample an input stream provided to the plurality of ADC channel circuits. For example, ADC channel circuits A and B may be said to be interleaved when they sample an input stream at different times in an ABABAB manner.

This disclosure initially describes, with reference to FIG. 1, various embodiments of an ADC circuit of an ADC circuit calibration system. Various embodiments of a postprocessing circuit of an ADC circuit are described with reference to FIG. 2A. Various embodiments of an exemplary stage circuit of an ADC channel circuit are described with reference to FIG. 2B. Exemplary transfer characteristics of an ADC stage circuit having various comparator thresholds are described with reference to FIG. 3. A second embodiment of an ADC circuit of an analog-to-digital converter circuit calibration system is described with reference to FIG. 4. A method of calibrating at least a portion of an analog-to-digital converter circuit is described with reference to FIG. 5. An embodiment of a computing system that includes an analog-to-digital converter circuit calibration system is described with reference to FIG. 6. Finally, a process of fabricating one embodiment of an analog-to-digital converter circuit calibration system is described with reference to FIG. 7.

Turning now to FIG. 1, a simplified block diagram illustrating one embodiment of an analog-to-digital converter (ADC) circuit 100 of an ADC circuit calibration system is shown. In the illustrated embodiment, ADC circuit 100 includes input signal distribution circuit 102, selection circuits 104*a-b*, ADC channel circuits 106*a-b*, calibration signal generation circuit 108, comparator threshold adjustment circuits 110*a-b*, and postprocessing circuit 112. As discussed further below with reference to FIG. 4, in various embodiments, additional or fewer circuits may be included. For example, ADC circuit 100 may include additional ADC channel circuits 106*a-b* or multiple calibration signal generation circuit 108. As another example, ADC circuit 100 may include only a single selection circuit 104. In some embodiments, various circuits of ADC circuit 100 may be arranged differently. For example, selection circuits 104*a-b* may be configured to receive input analog signal 118 and send input analog signal 118 to input signal distribution circuit 102.

Input signal distribution circuit 102 may receive input analog signal 118 and output distributed analog signals 120*a-b* to other portions of ADC circuit 100. Distributed analog signals 120*a-b* may be the same as input analog signal 118 or may be generated based on input analog signal 118. For example, input signal distribution circuit 102 may output input analog signal 118 as distributed analog signals 120*a* and 120*b* to selection circuits 104*a* and 104*b*, respectively. Distributed analog signal 120*a* and distributed analog signal 120*b* may be the same signal.

Similarly, calibration signal generation circuit 108 may provide calibration signals 124*a* and 124*b* to selection circuits 104*a* and 104*b*, respectively. In the illustrated embodiment, calibration signal 124*a* and calibration signal 124*b* are the same signal. Calibration signals 124*a-b* may be sent to selection circuits 104*a-b* sequentially or in parallel. In some embodiments, calibration signals 124*a* and 124*b* may be digital signals that calibration signal generation circuit 108 has converted into analog signals. In some embodiments, calibration signal generation circuit 108 may send a calibration signal to a selection circuit a plurality of times (e.g., to identify memory coefficients or to perform a calibration of a single ADC channel circuit). For example, calibration signal generation circuit 108 may send calibration signals 124*a* to selection circuit 104*a* a plurality of times. Similarly, calibration signal generation circuit 108 may send calibration signals 124b to selection circuit 104b a plurality of times.

Based on a mode of ADC circuit 100, selection circuits 104a and 104b may select between corresponding distributed analog signals 120 and calibration signals and send the signals to ADC channel circuits 106a-b as selected signals 122a and 122b. For example, based on an indication that ADC circuit 100 is in a normal mode, selection circuit 104a may select distributed analog signal 120a and send distributed analog signal 120a to ADC channel circuit 106a as selected signal 122a. As another example, based on an indication that ADC circuit 100 is in a calibration mode, selection circuit 104b may select calibration signal 124b and send calibration signal 124b to ADC channel circuit 106b as selected signal 122b. In some embodiments, when input analog signal 118 has various predetermined properties, distributed analog signals 120a-b may be used to calibrate ADC circuit 100.

ADC channel circuits 106a-b may include low-gain amplifiers, low speed amplifiers, or both, and corresponding comparators. In some embodiments, ADC channel circuits 106a-b may include chains of amplifiers and corresponding comparators, which may be organized as multiple stages. In some embodiments, as further discussed below with reference to FIG. 2B, the comparators may be used to convert some or all of an analog input signal (e.g., a corresponding selected signal or an output of an amplifier) into a digital output by performing a comparison between the analog input signal and various voltage levels. The voltage levels may correspond to comparator thresholds. ADC channel circuits 106a-b may generate one or more digital signals (e.g., digital signals 128a-b) based on the comparison. In some embodiments, the digital signal may indicate at least a portion of bits corresponding to an analog input signal (e.g., selected signals 122a-b). In some embodiments, each comparator may correspond to a respective amplifier. In other embodiments, one or more comparators may correspond to multiple amplifiers. In some embodiments, one or more amplifiers may be shared between multiple ADC channel circuits (e.g., ADC channel circuits 106a-b), between multiple stages of a single ADC channel circuit (e.g., ADC channel circuit 106a), or both. For example, a first stage (e.g., a first stage circuit) may use the amplifier in response to a rising edge of a clock cycle and a second stage (e.g., a second stage circuit) may use the amplifier in response to a falling edge of the clock cycle. Accordingly, ADC channel circuits 106a-b may amplify respective selected signals 122a-b, converting selected signals 122a-b into digital signals based on respective comparator thresholds. As discussed above, ADC channel circuits 106a-b may process signals less accurately, as compared to ADC channel circuits that include higher gain amplifiers. However, in some cases, ADC channel circuits 106a-b may consume less power and may output signals more quickly, as compared to ADC channel circuits including higher gain amplifiers. In some embodiments, ADC channel circuits 106a-b may include only a single comparator and a single amplifier. In other embodiments, one or more of ADC channel circuits 106a-b may include multiple comparators, multiple amplifiers, or both.

Comparator threshold adjustment circuits 110a-b may adjust the comparator thresholds of respective ADC channel circuits 106a-b by different amounts via threshold adjustment signals 126a-b. For example, comparator threshold adjustment circuit 110a may adjust the comparator threshold of ADC channel circuit 106a by a first amount and comparator threshold adjustment circuit 110b may adjust the comparator threshold of ADC channel circuit 106b by a second, different amount. As a result, in some cases, ADC channel circuits 106a and 106b may receive the same input signal and, due to the differing comparator thresholds, generate differing digital signals. ADC channel circuits 106a-b may output the digital signals as digital signals 128a and 128b, respectively.

As further described below with reference to FIG. 2A, postprocessing circuit 112 may identify an ADC coefficient of ADC channel circuits 106a-b (e.g., including an ADC coefficient of ADC channel circuits 106a-b). Based on the identified ADC coefficient, postprocessing circuit 112 may modify one or more of digital signals 128a and 128b and output a result as output digital signal(s) 130. As a result, in some cases, ADC circuit 100 may produce output digital signal(s) 130 having less error as compared to digital signals 128a-b. Further, output digital signal(s) 130 may be generated more quickly, as compared to a system where input signals are not interleaved. Additionally, output digital signal(s) 130 may be generated using less power, as compared to a system where ADC channel circuits including low-gain amplifiers are not used. In some cases, output digital signal(s) 130 may be generated using circuits having a smaller total area, as compared to a system where ADC channel circuits including low-gain amplifiers, low speed amplifiers, or both are not used. In some embodiments, postprocessing circuit 112 may align corresponding signals (e.g., by identifying distinct interleaved signals, by adjusting timings of corresponding signals of digital signals 128a-b, or both).

Figure 2A:
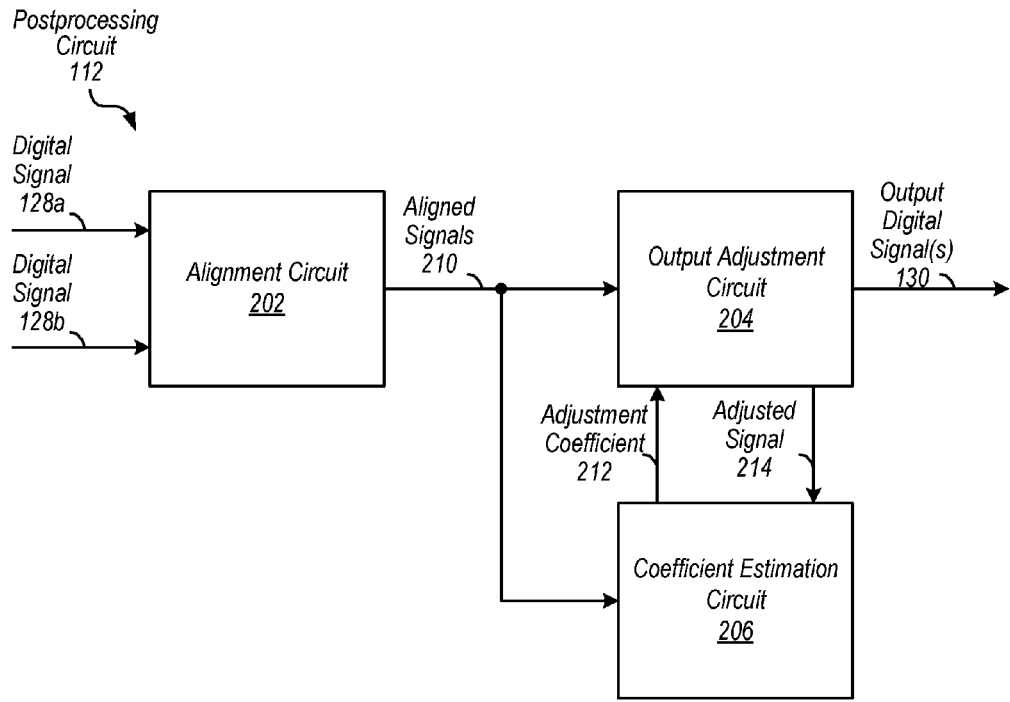
FIG. 2A is a block diagram illustrating one embodiment of a postprocessing circuit of an analog-to-digital converter circuit calibration system.

Turning now to FIG. 2A, a block diagram of an illustrative embodiment of postprocessing circuit 112 of FIG. 1 is shown. In the illustrated embodiment, alignment circuit 202, output adjustment circuit 204, and coefficient estimation circuit 206 are shown. In various embodiments, different quantities of circuits may be present. For example, postprocessing circuit 112 may include two alignment circuits 202 that correspond to respective digital signals 128. Additionally, in various embodiments, various other circuits may be included. For example, postprocessing circuit 112 may include calibration signal generation circuit 108.

As described above with reference to FIG. 1, in various embodiments, ADC channel circuits 106a-b may be interleaved. Accordingly, ADC channel circuits 106a-b may send digital signals 128a-b at different times. Additionally, in some embodiments, different bits may be converted by different stages of corresponding ADC channels and output at different times. Alignment circuit 202 may receive digital signals 128a-b and may align the outputs of ADC channel circuits 106a-b, outputting the aligned signals as aligned signals 210. Further, in some cases, alignment circuit 202 may adjust a timing associated with digital signals 128a-b such that digital signals 128a-b that correspond to a same input are output together. In other cases, digital signals 128a-b may be received at the same time or may be output at different times. Further, as discussed below with reference to FIGS. 2B and 4, in some embodiments, alignment circuit 202 may receive multiple portions (e.g., corresponding to bits) of a single digital signal (e.g., digital signal 128a) and merge the portions into a single signal.

Coefficient estimation circuit 206 may calculate an error value based on aligned signals 210 and adjusted signal 214 received from output adjustment circuit 204. For example, as discussed above, the error value for a three input signals may be calculated as follows:

$$e = \text{OUT1} - \text{OUT2} = \sum_{i=1}^{i=3N_{stg}} w_{i1}D_{i1} - w_{i2}D_{i2}$$

Coefficient estimation circuit 206 may determine, based on the error value, an adjustment coefficient 212 that indicates an identified ADC coefficient and may send adjustment coefficient 212 to output adjustment circuit 204. In some embodiments, the error value may be a mean square error. For example, in the illustrated embodiment, coefficient estimation circuit 206 may iteratively calculate the ADC coefficient using the steepest gradient descent algorithm:

$$w_{i1}[n+1] = w_{i1}[n] - \mu \frac{\delta e^2}{\delta w_{i1}}$$

$$w_{i2}[n+1] = w_{i2}[n] - \mu \frac{\delta e^2}{\delta w_{i2}}$$

$$w_{i1}[n+1] = w_{i1}[n] - 2\mu e D_{i1}$$

$$w_{i2}[n+1] = w_{i2}[n] + 2\mu e D_{i2}$$

where n represents an iteration of ADC coefficient $w_i$ and $\mu$ represents a least mean square coefficient constant. In some embodiments, some coefficients (e.g., $w_1$) may be fixed to a nominal value and may not be updated.

As discussed above, in some embodiments, postprocessing is performed when only a single ADC channel is considered (e.g., a same input signal is sent to one ADC channel multiple times). As a result, $w_{i1} = w_{i2}$ (referred to below as $w_i$) and the above formulas may be simplified as follows (still considering three input signals):

$$\text{OUT1} = \sum_{i=1}^{i=3N_{stg}} w_i D_{i1}$$

$$\text{OUT2} = \sum_{i=1}^{i=3N_{stg}} w_i D_{i2}$$

$$e = \text{OUT1} - \text{OUT2} = \sum_{i=1}^{i=3N_{stg}} w_i (D_{i1} - D_{i2})$$

$$w_i[n+1] = w_i[n] - \mu \frac{\delta e^2}{\delta w_i}$$

$$w_i[n+1] = w_i[n] - 2\mu e (D_{i1} - D_{i2})$$

Output adjustment circuit 204 may receive aligned signals 210 from alignment circuit 202 and adjustment coefficient 212 from coefficient estimation circuit 206. Output adjustment circuit 204 may generate output digital signal(s) 130 by modifying one or more of aligned signals 210 based on adjustment coefficient 212. In some embodiments, output digital signals(s) 130 may be generated based on aligned signals 210 and subsequently modified based on adjustment coefficient 212. Adjustment coefficient 212 may correspond to an identified ADC coefficient, as discussed above. In the illustrated embodiment, as a result of output adjustment circuit 204 modifying aligned signals 210 to produce output digital signal(s) 130, output digital signal(s) 130 may more closely represent an output generated using higher gain amplifiers, higher speed amplifiers, or both, as compared to an ADC circuit that does not include postprocessing circuit 112. Additionally, output adjustment circuit 204 may send adjusted signal 214 to coefficient estimation circuit 206. Adjusted signal 214 may be or may not be representative of output digital signal(s) 130.

Figure 2B:
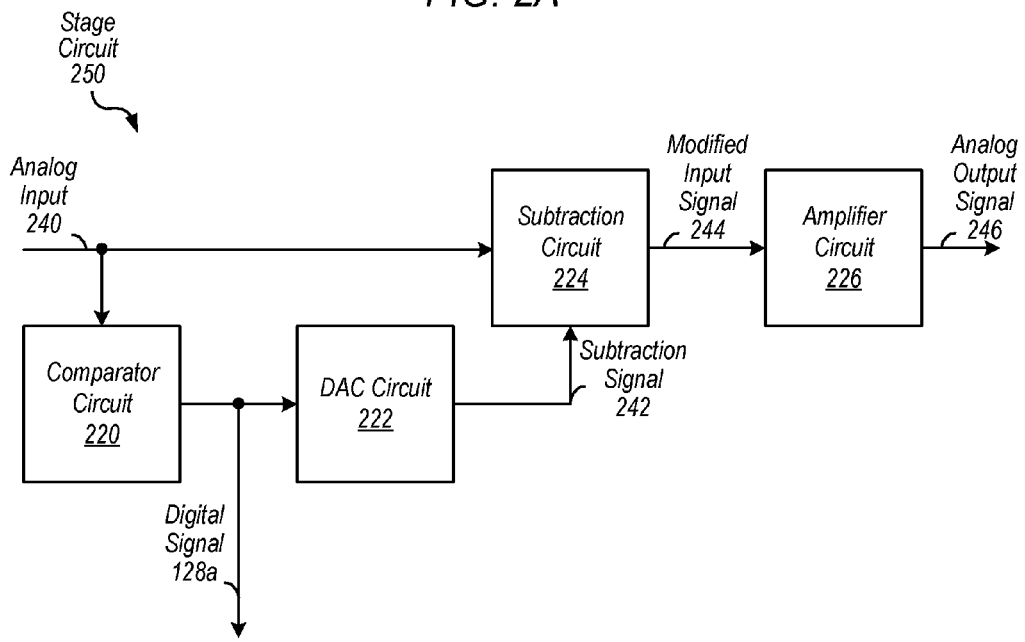
FIG. 2B is a block diagram illustrating an exemplary stage circuit of an analog-to-digital channel circuit.

Turning now to FIG. 2B, a block diagram of an illustrative embodiment an exemplary stage circuit 250 of an ADC channel of ADC circuit 100 of FIG. 1 is shown. In the illustrated embodiment, stage circuit 250 corresponds to a portion of ADC channel circuit 106a of FIG. 1. However, in other embodiments, various embodiments of stage circuit 250 may correspond to various other stages. In the illustrated embodiment, comparator circuit 220, digital-to-analog converter (DAC) circuit 222, subtraction circuit 224, and amplifier circuit 226 are shown. In various embodiments, stage circuit 250 may include various other circuits (e.g., one or more buffers). In some embodiments, stage circuit 250 may include fewer circuits (e.g., only including comparator circuit 220).

In the illustrated embodiment, stage circuit 250 receives analog input 240. Depending on a location of stage circuit 250 within ADC channel circuit 106a, analog input 240 may be selected signal 122a or an analog output signal of another stage within ADC channel circuit 106a. Comparator circuit 220 may compare analog input 240 to various voltage levels (comparator thresholds). Based on the comparisons, comparator circuit 220 may generate digital signal 128a. Digital signal 128a may be a portion of a digital signal sent to postprocessing circuit 112 (e.g., corresponding to a portion of bits). DAC circuit 222 may convert digital signal 128a into subtraction signal 242 (an analog signal). Subtraction circuit 224 may subtract subtraction signal 242 from analog input 240, resulting in a portion of analog input 240 not represented by digital signal 128a. The resulting signal may be sent to amplifier circuit 226 as modified input signal 244. Amplifier circuit 226 may amplify modified input signal 244, generating analog output signal 246. In some embodiments, amplifier circuit 226 may include a low-gain amplifier, a low speed amplifier, or both. In some embodiments, analog output signal 246 may be sent to another stage of ADC channel circuit 106a. In some embodiments, analog output signal 246 may be unused (e.g., because digital signal 128a from comparator circuit 220 corresponds to the least significant bits of an output having a desired output resolution). In various embodiments, different stages may have a same structural arrangement (e.g., a same number of comparators). In some embodiments, different stages may include different numbers of comparators and may be configured to generate digital signals corresponding to different numbers of digital bits.

Figure 3:
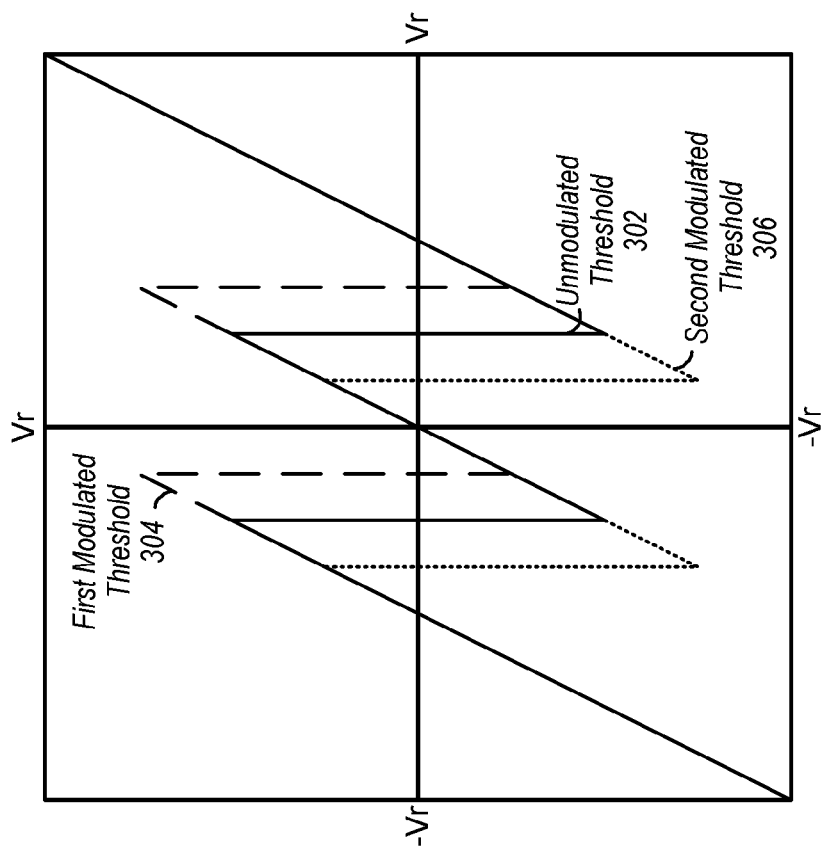
FIG. 3 is a diagram illustrating exemplary transfer characteristics of a stage circuit having various comparator thresholds.

Turning now to FIG. 3, a diagram that illustrates transfer characteristics of an embodiment of a stage circuit (e.g., of stage circuit 250 of FIG. 2B) of an analog-to-digital converter (ADC) circuit, where comparator thresholds of two comparators of the stage circuit are modified by various amounts is shown. In the illustrated embodiment, a transfer characteristic of a stage circuit including comparators having an unmodulated threshold 302, a first modulated threshold 304, and a second modulated threshold 306 are shown. For example, unmodulated threshold 302 may represent a transfer characteristic of a 1.5-bit stage circuit (e.g., included in ADC channel circuit 106a of FIG. 1) including one or more comparators prior to receiving a threshold adjustment signal (e.g., threshold adjustment signal 126a). First modulated threshold 304 may represent a transfer characteristic of a one-bit stage including a comparator having a threshold that has been modified by a first amount by a threshold adjustment signal. Similarly, second modulated threshold 306 may represent a transfer characteristic of a one-bit stage including a comparator having a threshold that has been modified by a second amount by a threshold adjustment signal 126.

Figure 4:
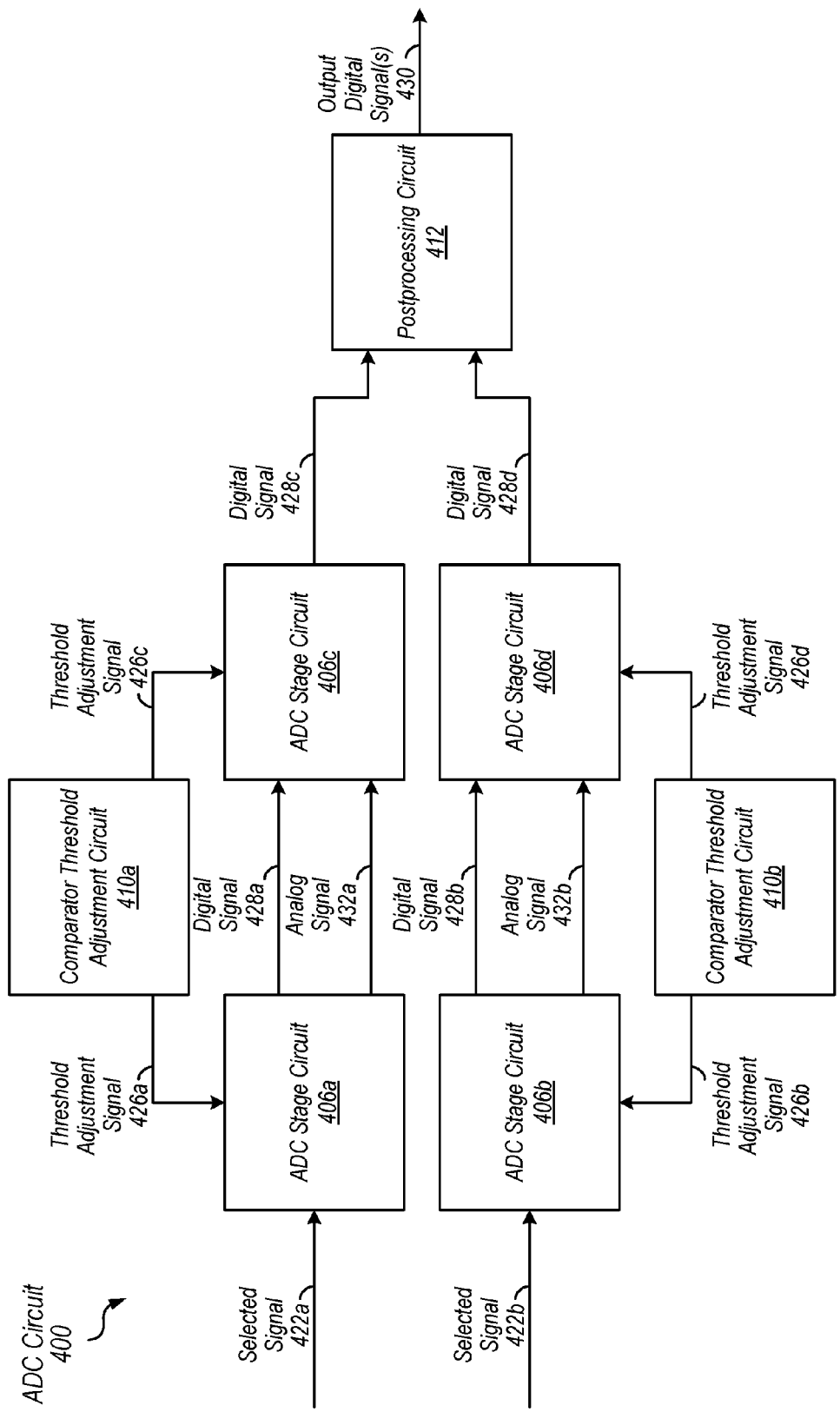
FIG. 4 is a block diagram illustrating a second embodiment of an analog-to-digital converter circuit of an analog-to-digital converter circuit calibration system.

Turning now to FIG. 4, a simplified block diagram illustrating one embodiment of an analog-to-digital converter (ADC) circuit 400 of an ADC circuit calibration system is shown. In the illustrated embodiment, ADC circuit 400 includes ADC stage circuits 406a-d, comparator threshold adjustment circuits 410a-b, and postprocessing circuit 412. As discussed further below, ADC circuit 400 may operate similarly to ADC circuit 100 of FIG. 1. However, ADC circuit 400 includes ADC stage circuits 406a-d rather than ADC channel circuits 106a-b. In various embodiments, one or more ADC stage circuits (e.g., ADC stage circuits 406a and 406c) may correspond to a single ADC channel circuit (e.g., ADC channel circuit 106a). In some embodiments, one or more of ADC stage circuits 406a-d may correspond to stage circuit 250 of FIG. 2B. In various embodiments, other numbers of ADC stage circuits, numbers of selected signals, etc. may be used.

ADC circuit 400 may function similarly to ADC circuit 100 of FIG. 1. Accordingly, selected signals 422a-b, which may be generated in a manner similar to selected signals 122a-b of FIG. 1, may be received at ADC stage circuits 406a-b. Based on corresponding comparator thresholds, portions of selected signals 422a-b may be converted into digital signals and may be output as digital signals 428a-b, respectively. Further, as discussed above with reference to FIG. 2B, remaining portions of selected signals 422a-b may be amplified and output as analog signals 432a-b. ADC stage circuits 406c-d may receive digital signals 428a-b, respectively, and analog signals 432a-b, respectively. ADC stage circuits 406c-d, may convert other portions of selected signal 422a into digital signals 428c-d, respectively, using respective comparators, amplifiers, or both. In some embodiments, the amplifiers of ADC stage circuits 406a-d may be low-gain amplifiers, low speed amplifiers, or both. In the illustrated embodiment, digital signals 428c-d include digital signals 428a-b, respectively. However, in other embodiments, ADC stage circuits may individually send digital signals to postprocessing circuit 412. For example, ADC stage circuit 406a may send digital signal 428a to postprocessing circuit 412 and ADC stage circuit 406c may similarly send digital signal 428c to postprocessing circuit 412.

Similar to comparator threshold adjustment circuits 110a-b of FIG. 1, comparator threshold adjustment circuits 410a-b may modify the comparator thresholds at ADC stage circuits 406a-d. The comparator thresholds may be modified by pseudorandom amounts, which may be generated by comparator threshold adjustment circuits 410a-b or by other circuits. In the illustrated embodiment, comparator threshold adjustment circuit 410a adjusts the comparator threshold of ADC stage circuit 406a via threshold adjustment signal 426a and adjusts the comparator threshold of ADC stage circuit 406c via threshold adjustment signal 426c. In the illustrated embodiment, comparator threshold adjustment circuit 410b adjusts the comparator threshold of ADC stage circuit 406b via threshold adjustment signal 426b and adjusts the comparator threshold of ADC stage circuit 406d via threshold adjustment signal 426d. However, in other embodiments, different numbers of comparator threshold adjustment circuits may be used. For example, a separate comparator threshold adjustment circuit may send threshold adjustment circuits to each comparator of ADC stage circuits 406a-d, a single comparator threshold adjustment circuit may send threshold adjustment circuits to each comparator of ADC stage circuits 406a-d, or other quantities of comparator threshold adjustment circuits may be used.

Similar to postprocessing circuit 112 of FIGS. 1 and 2A, postprocessing circuit 412 may receive digital signals 428c-d, identify an ADC coefficient of ADC stage circuits 406a-d, and modify one or of digital signals 428c-d to generate output digital signal(s) 430. Additionally, postprocessing circuit 412 may align various inputs. Accordingly, if digital signals (e.g., digital signals 428a and 428c) are received separately, postprocessing circuit 412 may order (e.g., align) the digital signals into a single signal prior to identifying the ADC coefficient.

Figure 5:
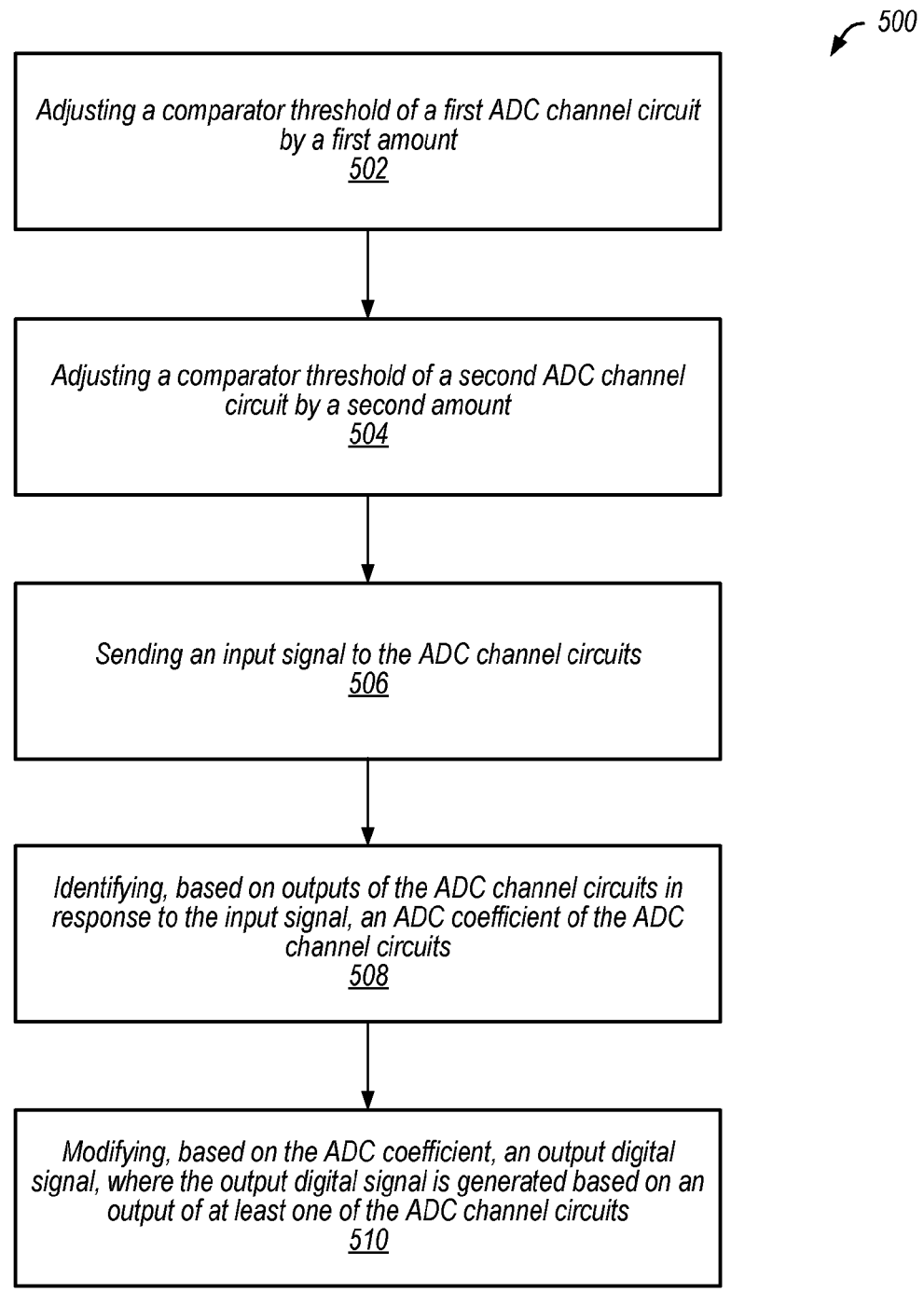
FIG. 5 is a flow diagram illustrating one embodiment of a method of calibrating at least a portion of an analog-to-digital converter circuit.

Referring now to FIG. 5, a flow diagram of a method 500 of calibrating at least a portion of an analog-to-digital converter (ADC) circuit. In some embodiments, method 500 may be initiated or performed in response to one or more instructions stored by a computer-readable storage medium.

At 502, method 500 includes adjusting a comparator threshold of a first ADC channel circuit by a first amount. For example, method 500 may include comparator threshold adjustment circuit 110a of FIG. 1 adjusting a comparator threshold (e.g., one comparator threshold or more than one comparator threshold) of ADC channel circuit 106a by a first amount. At 504, method 500 includes adjusting a comparator threshold of a second ADC channel circuit by a second amount. For example, method 500 may include comparator threshold adjustment circuit 110b adjusting a comparator threshold of ADC channel circuit 106b by a second amount.

At 506, method 500 includes sending an input signal to the ADC channel circuits. For example, method 500 may include calibration signal generation circuit 108 sending, via selection circuits 104a-b, selected signals 122a-b to ADC channel circuits 106a-b, respectively. At 508, method 500 includes identifying, based on outputs of the ADC channel circuits in response to the input signal, an ADC coefficient of the ADC channel circuits. For example, method 500 may include coefficient estimation circuit 206 of FIG. 2A identifying, based on digital signals 128a-b, an ADC coefficient of ADC channel circuit 106b (e.g., a stage gain coefficient or a memory coefficient caused by at least one of the amplifiers of the ADC channel circuits, the comparators of the ADC channel circuits, or other circuits of the ADC channel circuits).

At 510, method 500 includes modifying, based on the ADC coefficient, an output digital signal, where the output digital signal is generated based on an output of at least one of the ADC channel circuits. For example, method 500 may include output adjustment circuit 204 modifying an output digital signal generated based on digital signal 128b based on the ADC coefficient and outputting a resulting signal as output digital signal(s) 130. Accordingly, a method of calibrating at least a portion of an ADC circuit is depicted.

Figure 6:
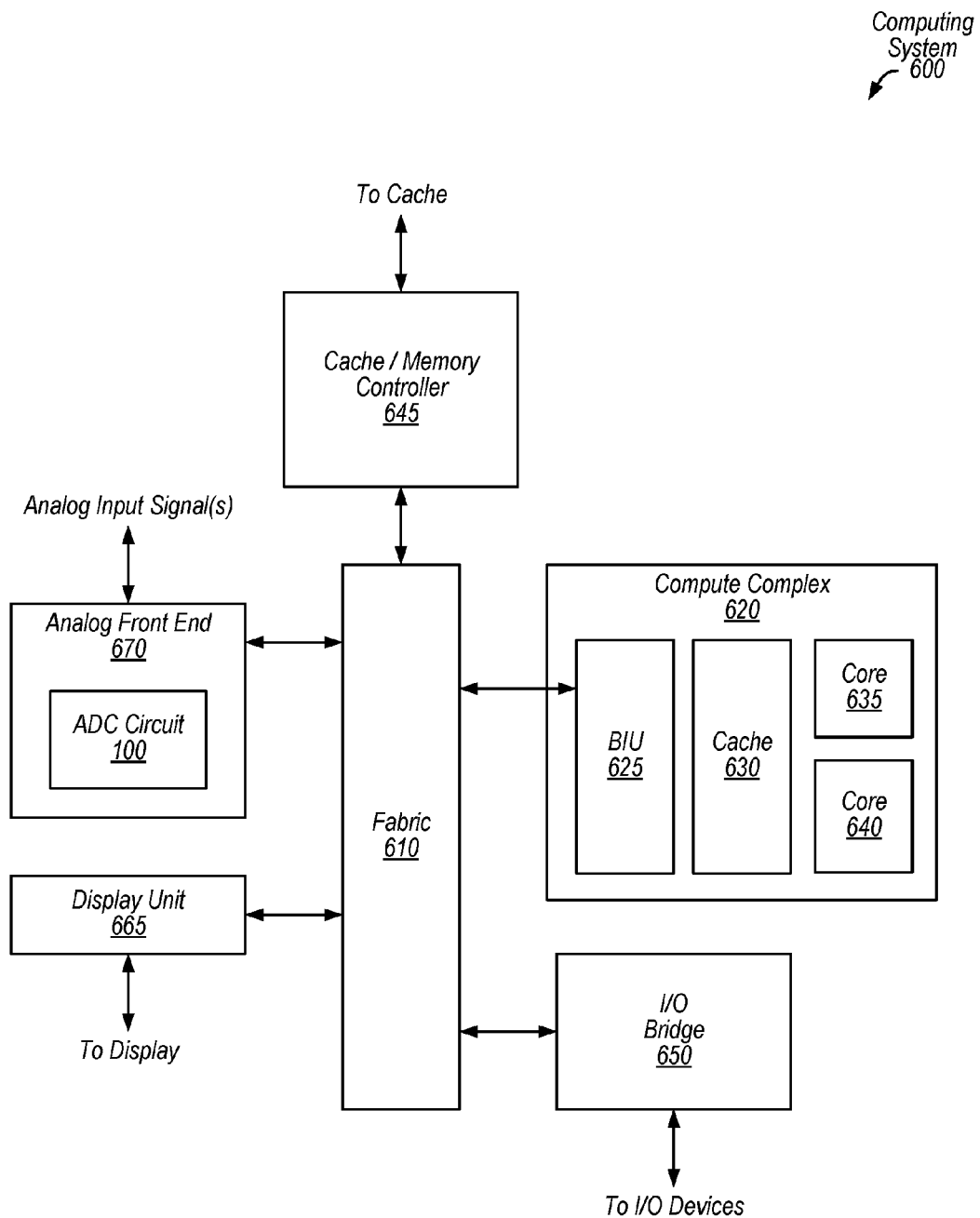
FIG. 6 is a block diagram illustrating an embodiment of an exemplary computing system that includes at least a portion of an analog-to-digital converter circuit calibration system.

Turning next to FIG. 6, a block diagram illustrating an exemplary embodiment of a computing system 600 that includes at least a portion of an analog-to-digital converter (ADC) circuit calibration system. The computing system 600 includes ADC circuit 100 of FIGS. 1 and 2. In some embodiments, ADC circuit 100 includes one or more of the circuits described above with reference to FIG. 1, including any variations or modifications described previously with reference to FIGS. 1-5. In some embodiments, some or all elements of the computing system 600 may be included within a system on a chip (SoC). In some embodiments, computing system 600 is included in a mobile device. Accordingly, in at least some embodiments, area and power consumption of the computing system 600 may be important design considerations. In the illustrated embodiment, the computing system 600 includes fabric 610, analog front end 670, compute complex 620, input/output (I/O) bridge 650, cache/memory controller 645, and display unit 665. In the illustrated embodiment, ADC circuit 100 is included in analog front end 670. However, in other embodiments, ADC circuit 100 may be connected to or included in other components of the computing system 600 (e.g., I/O bridge 650 or core 635). Additionally, the computing system 600 may include multiple ADC circuits 100. The multiple ADC circuits 100 may correspond to different embodiments or to the same embodiment.

Fabric 610 may include various interconnects, buses, MUXes, controllers, etc., and may be configured to facilitate communication between various elements of computing system 600. In some embodiments, portions of fabric 610 are configured to implement various different communication protocols. In other embodiments, fabric 610 implements a single communication protocol and elements coupled to fabric 610 may convert from the single communication protocol to other communication protocols internally.

In the illustrated embodiment, compute complex 620 includes bus interface unit (BIU) 625, cache 630, and cores 635 and 640. In various embodiments, compute complex 620 includes various numbers of cores and/or caches. For example, compute complex 620 may include 1, 2, or 4 processor cores, or any other suitable number. In some embodiments, cores 635 and/or 640 include internal instruction and/or data caches. In some embodiments, a coherency unit (not shown) in fabric 610, cache 630, or elsewhere in computing system 600 is configured to maintain coherency between various caches of computing system 600. BIU 625 may be configured to manage communication between compute complex 620 and other elements of computing system 600. Processor cores such as cores 635 and 640 may be configured to execute instructions of a particular instruction set architecture (ISA), which may include operating system instructions and user application instructions.

Cache/memory controller 645 may be configured to manage transfer of data between fabric 610 and one or more caches and/or memories (e.g., non-transitory computer readable mediums). For example, cache/memory controller 645 may be coupled to an L3 cache, which may, in turn, be coupled to a system memory. In other embodiments, cache/memory controller 645 is directly coupled to a memory. In some embodiments, the cache/memory controller 645 includes one or more internal caches. In some embodiments, the cache/memory controller 645 may include or be coupled to one or more caches and/or memories that include instructions that, when executed by one or more processors (e.g., compute complex 620), cause the processor, processors, or cores to initiate or perform some or all of the processes described above with reference to FIGS. 1-5 or below with reference to FIG. 7.

As used herein, the term "coupled to" may indicate one or more connections between elements, and a coupling may include intervening elements. For example, in FIG. 6, display unit 665 may be described as "coupled to" compute complex 620 through fabric 610. In contrast, in the illustrated embodiment of FIG. 6, display unit 665 is "directly coupled" to fabric 610 because there are no intervening elements.

Display unit 665 may be configured to read data from a frame buffer and provide a stream of pixel values for display. Display unit 665 may be configured as a display pipeline in some embodiments. Additionally, display unit 665 may be configured to blend multiple frames to produce an output frame. Further, display unit 665 may include one or more interfaces (e.g., MIPI® or embedded display port (eDP)) for coupling to a user display (e.g., a touchscreen or an external display).

I/O bridge 650 may include various elements configured to implement: universal serial bus (USB) communications, security, audio, and/or low-power always-on functionality, for example. I/O bridge 650 may also include interfaces such as pulse-width modulation (PWM), general-purpose input/output (GPIO), serial peripheral interface (SPI), and/or inter-integrated circuit (I2C), for example. Various types of peripherals and devices may be coupled to computing system 600 via I/O bridge 650.

Analog front end 670 may include various elements configured to receive various analog input signals, convert the analog input signals into digital signals, and send the digital signals to various devices of computing system 600 (e.g., via fabric 610). In some embodiments, the analog input signals may be converted using ADC circuit 100, as described above. In some embodiments (e.g., when computing system 600 includes various devices configured to receive analog signals), analog front end 670 may forward the analog signals to various devices of computing system 600 without converting the analog signals into digital signals.

Figure 7:
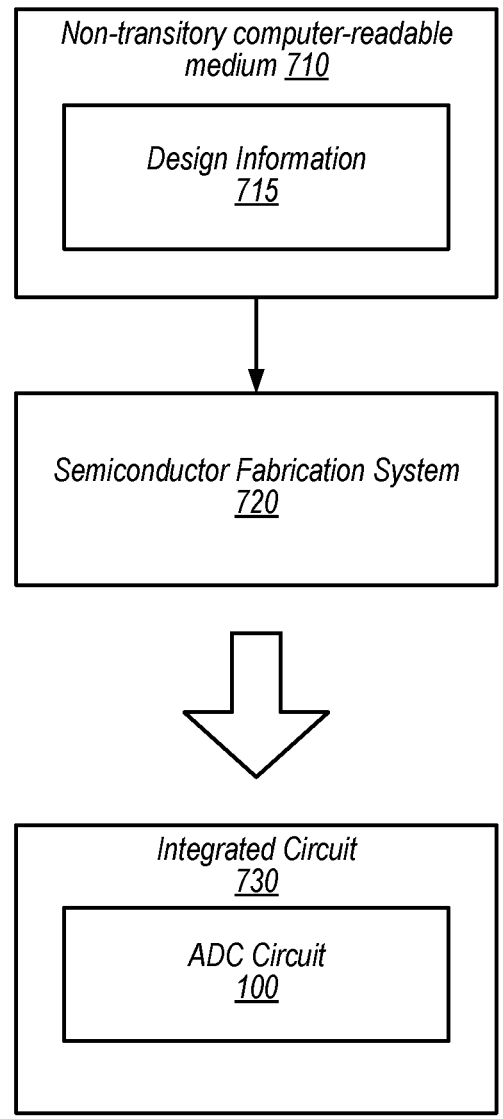
FIG. 7 is a block diagram illustrating one embodiment of a process of fabricating at least a portion of an analog-to-digital converter circuit calibration system.

FIG. 7 is a block diagram illustrating a process of fabricating at least a portion of an analog-to-digital converter circuit calibration system. FIG. 7 includes a non-transitory computer-readable medium 710 and a semiconductor fabrication system 720. Non-transitory computer-readable medium 710 includes design information 715. FIG. 7 also illustrates a resulting fabricated integrated circuit 730. In the illustrated embodiment, integrated circuit 730 includes ADC circuit 100 of FIG. 1. However, in other embodiments, integrated circuit 730 may include other circuits, such as ADC circuit 400. In some embodiments, integrated circuit 730 may include multiple circuits, which may correspond to any combination of the ADC circuits discussed herein. In the illustrated embodiment, semiconductor fabrication system 720 is configured to process design information 715 stored on non-transitory computer-readable medium 710 and fabricate integrated circuit 730.

Non-transitory computer-readable medium 710 may include any of various appropriate types of memory devices or storage devices. For example, non-transitory computer-readable medium 710 may include at least one of an installation medium (e.g., a CD-ROM, floppy disks, or tape device), a computer system memory or random access memory (e.g., DRAM, DDR RAM, SRAM, EDO RAM, Rambus RAM, etc.), a non-volatile memory such as a Flash, magnetic media (e.g., a hard drive, or optical storage), registers, or other types of non-transitory memory. Non-transitory computer-readable medium 710 may include two or more memory mediums, which may reside in different locations (e.g., in different computer systems that are connected over a network).

Design information 715 may be specified using any of various appropriate computer languages, including hardware description languages such as, without limitation: VHDL, Verilog, SystemC, SystemVerilog, RHDL, M, MyHDL, etc. Design information 715 may be usable by semiconductor fabrication system 720 to fabricate at least a portion of integrated circuit 730. The format of design information 715 may be recognized by at least one semiconductor fabrication system 720. In some embodiments, design information 715 may also include one or more cell libraries, which specify the synthesis and/or layout of integrated circuit 730. In some embodiments, the design information is specified in whole or in part in the form of a netlist that specifies cell library elements and their connectivity. Design information 715, taken alone, may or may not include sufficient information for fabrication of a corresponding integrated circuit (e.g., integrated circuit 730). For example, design information 715 may specify circuit elements to be fabricated but not their physical layout. In this case, design information 715 may be combined with layout information to fabricate the specified integrated circuit.

Semiconductor fabrication system 720 may include any of various appropriate elements configured to fabricate integrated circuits. This may include, for example, elements for depositing semiconductor materials (e.g., on a wafer, which may include masking), removing materials, altering the shape of deposited materials, modifying materials (e.g., by doping materials or modifying dielectric constants using ultraviolet processing), etc. Semiconductor fabrication system 720 may also be configured to perform various testing of fabricated circuits for correct operation.

In various embodiments, integrated circuit 730 is configured to operate according to a circuit design specified by design information 715, which may include performing any of the functionality described herein. For example, integrated circuit 730 may include any of various elements described with reference to FIGS. 1-6. Further, integrated circuit 730 may be configured to perform various functions described herein in conjunction with other components. The functionality described herein may be performed by multiple connected integrated circuits.

As used herein, a phrase of the form "design information that specifies a design of a circuit configured to . . . " does not imply that the circuit in question must be fabricated in order for the element to be met. Rather, this phrase indicates that the design information describes a circuit that, upon being fabricated, will be configured to perform the indicated actions or will include the specified components.

In some embodiments, a method of initiating fabrication of integrated circuit 730 is performed. Design information 715 may be generated using one or more computer systems and stored in non-transitory computer-readable medium 710. The method may conclude when design information 715 is sent to semiconductor fabrication system 720 or prior to design information 715 being sent to semiconductor fabrication system 720. Accordingly, in some embodiments, the method may not include actions performed by semiconductor fabrication system 720. Design information 715 may be sent to fabrication system 720 in a variety of ways. For example, design information 715 may be transmitted (e.g., via a transmission medium such as the Internet) from non-transitory computer-readable medium 710 to semiconductor fabrication system 720 (e.g., directly or indirectly). As another example, non-transitory computer-readable medium 710 may be sent to semiconductor fabrication system 720. In response to the method of initiating fabrication, semiconductor fabrication system 720 may fabricate integrated circuit 730 as discussed above.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. A system, comprising:
    at least two analog-to-digital converter (ADC) channel circuits configured to receive an analog input signal and output a respective digital signal;
    a calibration signal generation circuit configured to send a particular analog input signal to the at least two ADC channel circuits;
    a comparator threshold adjustment circuit configured to pseudorandomly modify a respective comparator threshold of the at least two ADC channel circuits; and
    a postprocessing circuit configured to:
        identify, based on at least two digital signals received from respective ADC channel circuits of the at least two ADC channel circuits, an ADC coefficient of the at least two ADC channel circuits; and
        modify, based on the ADC coefficient, an output digital signal of the postprocessing circuit, wherein the output digital signal is generated based on at least one digital signal from the at least two ADC channel circuits.

2. The system of claim 1, wherein the calibration signal generation circuit is configured to send the particular analog input signal to the at least two ADC channel circuits a plurality of times.

3. The system of claim 1, wherein the postprocessing circuit is further configured to align a plurality of the at least two digital signals from the at least two ADC channel circuits, wherein the postprocessing circuit is configured to identify the ADC coefficient based on the aligned digital signals of the at least two ADC channel circuits.

4. The system of claim 3, wherein the plurality of digital signals are received from different stages of a particular ADC channel circuit, and wherein, to align the plurality of digital signals, the postprocessing circuit is configured to merge a first digital signal from a first stage of with a second digital signal from a second stage of the particular ADC channel circuit.

5. The system of claim 3, wherein, to align the plurality of digital signals, the postprocessing circuit is configured to delay a first digital signal from a first ADC channel circuit until a second digital signal from a second ADC channel circuit is received.

6. The system of claim 1, wherein the postprocessing circuit is configured to identify the ADC coefficient based on a previous digital signal received from at least one of the ADC channel circuits.

7. The system of claim 6, wherein the postprocessing circuit is configured to identify the ADC coefficient by iteratively updating a previously identified ADC coefficient.

8. The system of claim 1, wherein the calibration signal generation circuit includes a digital to analog converter configured to convert a predetermined digital signal into the same input signal.

9. The system of claim 1, wherein a particular ADC channel circuit of the at least two ADC channel circuits includes a first stage and a second stage,
  wherein the first stage is configured to receive at least a portion of the analog input signal and output:
    a first digital signal indicative of a portion of the analog input signal and
    an analog output signal corresponding to the analog input signal minus a portion of the analog input signal corresponding to the first digital signal
  wherein the second stage is configured to receive the analog output signal from the first stage and output a second digital signal.

10. The system of claim 9, wherein the first stage includes a low-gain amplifier and a first comparator, and wherein the second stage includes a second comparator.

11. The system of claim 10, wherein the second stage is configured to amplify a second analog output signal using the low-gain amplifier of the first stage.

12. A method, comprising:
  adjusting a comparator threshold of a first analog-to-digital converter (ADC) channel circuit by a first amount;
  adjusting a comparator threshold of a second ADC channel circuit by a second amount;
  sending an input signal to the ADC channel circuits;
  identifying, based on outputs of the ADC channel circuits in response to the input signal, an ADC coefficient of the ADC channel circuits; and
  modifying, based on the ADC coefficient, an output digital signal, wherein the output digital signal is generated based on an output of at least one of the ADC channel circuits.

13. The method of claim 12, further comprising:
  subsequent to receiving the outputs from the ADC channel circuits, receiving different outputs from the ADC channel circuits in response to a different input signal;
  generating, based on the different outputs and based on the ADC coefficient, an updated ADC coefficient; and
  modifying a second output digital signal based on the updated ADC coefficient.

14. The method of claim 12, further comprising, prior to identifying the respective ADC coefficients, aligning the outputs of the ADC channel circuits in response to the input signal.

15. The method of claim 12, wherein the first ADC channel circuit and the second ADC channel circuit both amplify respective analog output signals via a shared low-gain amplifier.

16. A non-transitory computer readable storage medium having stored thereon design information that specifies a circuit design in a format recognized by a fabrication system that is configured to use the design information to fabricate a hardware integrated circuit that includes:
  a plurality of analog-to-digital converter (ADC) channel circuits configured to receive an analog input signal and output respective digital signals;
  a calibration signal generation circuit configured to send a same input signal to the plurality of ADC channel circuits;
  a comparator threshold adjustment circuit configured to pseudorandomly modify respective comparator thresholds of the plurality of ADC channel circuits by different amounts; and
  a postprocessing circuit configured to:
    identify, based on a plurality of digital signals from the plurality of ADC channel circuits, an ADC coefficient; and
    modify, based on the ADC coefficient, an output digital signal of the postprocessing circuit, wherein the output digital signal is generated based on at least one digital signal from at least one of the plurality of ADC channel circuits.

17. The computer readable storage medium of claim 16, wherein a first ADC channel circuit of the plurality of ADC channel circuits is configured to sample the analog input signal at a different time from a second ADC channel circuit of the plurality of ADC channel circuits.

18. The computer readable storage medium of claim 16, wherein the postprocessing circuit is configured to iteratively update the ADC coefficient based on one or more additional digital signals of the plurality of ADC channel circuits.

19. The computer readable storage medium of claim 16, wherein the postprocessing circuit is configured to identify the ADC coefficient based on a mean square error calculated based on at least a digital signal from a first ADC channel circuit of the plurality of ADC channel circuits and a digital signal from a second ADC channel circuit of the plurality of ADC channel circuits.

20. The computer readable storage medium of claim 18, wherein the ADC channel circuits are configured to generate the one or more additional digital signals based on a different portion of the same input signal.

* * * * *